United States Patent [19]
Cho et al.

[11] Patent Number: 6,146,492
[45] Date of Patent: Nov. 14, 2000

[54] PLASMA PROCESS APPARATUS WITH IN SITU MONITORING, MONITORING METHOD, AND IN SITU RESIDUE CLEANING METHOD

[75] Inventors: Sung-bum Cho; Hak-pil Kim, both of Kyungki-do; Eun-hee Shin; Baik-soon Choi, both of Seoul, all of Rep. of Korea

[73] Assignee: Samsung Electronics Co., Ltd., Suwon, Rep. of Korea

[21] Appl. No.: 09/172,140

[22] Filed: Oct. 14, 1998

[30] Foreign Application Priority Data

Dec. 30, 1997 [KR] Rep. of Korea .................. 97-79194

[51] Int. Cl.[7] .......................... H05H 1/00; C23C 16/00
[52] U.S. Cl. ............................ 156/345; 118/715
[58] Field of Search .................... 156/345; 118/715, 118/719, 728, 733, 729; 204/298.31, 298.32, 298.01; 315/111.21; 134/1.1, 1.2, 1.3

[56] References Cited

U.S. PATENT DOCUMENTS

| | | | |
|---|---|---|---|
| 4,786,352 | 11/1988 | Benzing | 156/345 |
| 5,322,590 | 6/1994 | Koshimizu | 156/345 |
| 5,409,562 | 4/1995 | Kumihashi et al. | 156/345 |
| 5,900,105 | 5/1999 | Toshima | 156/345 |
| 5,928,426 | 7/1999 | Aitchison | 118/715 |

*Primary Examiner*—Gregory Mills
*Assistant Examiner*—Parviz Hassonzadeh
*Attorney, Agent, or Firm*—Jones Volentine, L.L.C.

[57] ABSTRACT

A plasma process apparatus having a plasma chamber with in situ monitoring, a monitoring method, and a method for in situ cleaning a plasma chamber. The apparatus includes a sampling manifold which induces flow of a sample gas from a plasma chamber through the manifold. A gas analyzer analyzes the sample gas flowing through the sampling manifold. The in situ monitoring method monitors an initial gas to establish background levels, and bakes the apparatus to reduce contaminants, if necessary. The monitoring method then monitors a process reaction and, after unloading a wafer and discharging a waste gas, monitors an in situ cleaning reaction. Monitoring involves inducing flow of a gas from the plasma chamber through the sampling manifold, and then analyzing the gas in the manifold with a gas analyzer. The cleaning method includes using a mixture of sulfur hexafluoride and chlorine to clean the plasma chamber after etching a polysilicon layer.

23 Claims, 10 Drawing Sheets

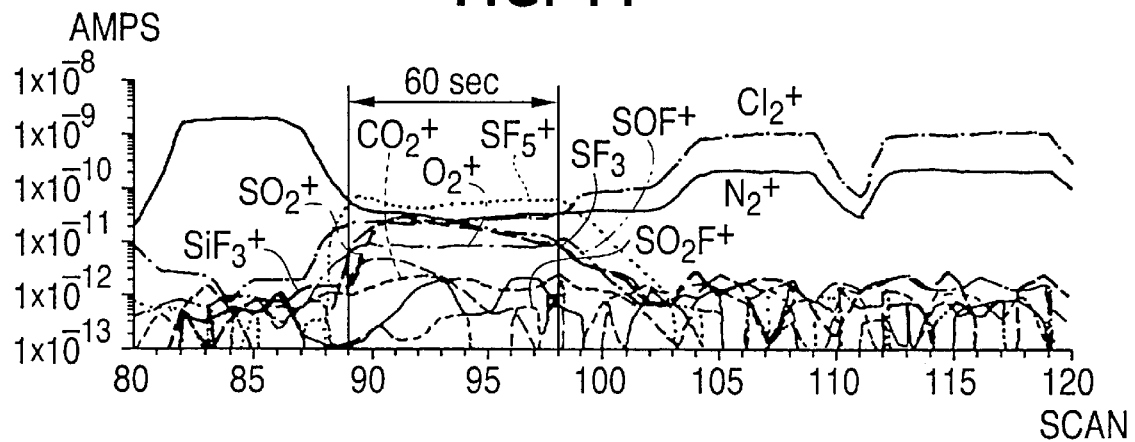
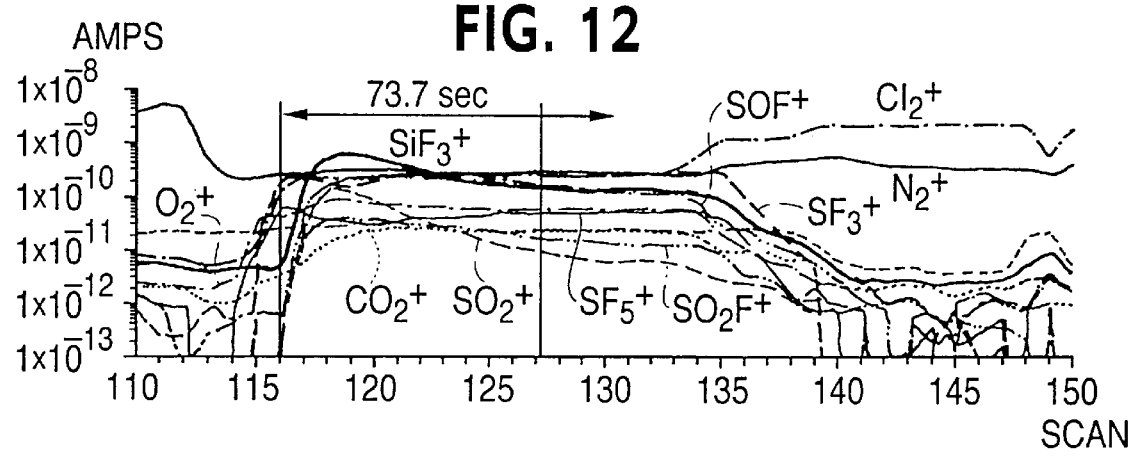

PLASMA PROCESS APPARATUS WITH IN SITU MONITORING, MONITORING METHOD, AND IN SITU RESIDUE CLEANING METHOD

BACKGROUND OF THE INVENTION

1. Field of the Invention

The present invention relates to a plasma process apparatus with in situ monitoring, a method for monitoring using the apparatus, and a method for cleaning a chamber used in the apparatus. More particularly, the present invention relates to in situ monitoring a plasma chamber using a sampling manifold connected to the chamber and a gas analyzer connected to the manifold, and includes a method for in situ monitoring a plasma process and a method for cleaning the plasma chamber after etching. In addition, the present invention relates to an optimized in situ cleaning method for removing residues inside a plasma chamber after etching polysilicon.

2. Description of the Related Art

Generally, semiconductor device fabrication processes are carried out in processing chambers in which specific processing conditions, such as temperature and pressure, are preset and processing environments are created. In particular, a plasma process, such as a plasma etching process and a plasma enhanced chemical vapor deposition (PECVD) process, generates many by-products. These by-products react with gas, photoresist, or other materials present inside the processing chamber to create polymer materials. The polymer becomes attached to the wafer surface and the inside surfaces of the processing chamber, causing the processing parameters to deviate from the preset values, and generating particles. Particles cause wafer defects which result in a decrease in the productive yield of a semiconductor fabrication facility.

In order to reduce defects, preventive maintenance (PM) for the processing chamber is carried out on a certain schedule. Because the equipment can not be operated during PM, productivity is also reduced by frequent PM.

FIG. 1 shows the PM process for the conventional processing chamber. Equipment for a specific process of semiconductor fabrication, with a chamber requiring PM, is removed from operation, is powered off, has its vacuum released, and is allowed to cool down. When the processing chamber is sufficiently cooled down, the components of the processing chamber are disassembled. In the case of chambers used in plasma processes, the surfaces of each of the disassembled components are wet-etched to remove the by-products of plasma processing. The wet-etch normally uses chemicals in the hydrogen fluoride (HF) series in order to remove the polysilicon film or silicon nitride film. Then, after re-assembling the components, a vacuum pump is again operated to reestablish a vacuum, the power is turned on, and the equipment is brought on line. Test wafers are then loaded into the processing chamber of the equipment, and an aging process ensues. After aging, the test wafers are examined during Process Recertification, in order to check whether the processing chamber is ready for operational use.

However, the PM method described has some drawbacks. The method is expensive, wastes energy and takes a long time (over 24 hours).

In order to overcome the time problem, a plasma etch can be carried out using nitrogen trifluoride ($NF_3$), or carbon tetrafluoride ($CF_4$) instead of the wet etch. Alternatively, Thermal Shock Technology is employed to remove, by means of thermal stress, the films formed inside the chamber. In another alternative, a dry etch is performed using chlorine trifluoride ($ClF_3$), or bromine pentafluoride ($BrF_5$). Even with this alternative, the removal, the disassembly and the assembly are still required thereby resulting in the same economic losses and power waste.

In situ cleaning, without disassembly and assembly, for the processing chamber using dry etch gas has been introduced. However, it is difficult to measure the cleaning reaction precisely as it is being carried out and to determine the most efficient cleaning conditions. Thus, proper utilization of the in situ cleaning function is difficult, and optical utilization is unlikely.

SUMMARY OF THE INVENTION

The present invention is directed to an apparatus and methods which substantially overcomes one or more problems due to the limitations and the disadvantages of the related art, An object of the present invention is to provide an apparatus and method for performing a plasma process with in situ monitoring, including performing a plasma etch process for the formation of polysilicon storage electrodes on a semiconductor wafer.

It is another object to provide an in situ cleaning process for a plasma chamber of the apparatus after the plasma etch process.

It is another object to optimize an in situ cleaning process based on results from monitoring a cleaning process in a plasma chamber.

To achieve these and other objects and advantages in accordance with the present invention, a plasma process apparatus with in situ monitoring includes a plasma chamber and a process gas supply in flow communication with the plasma chamber, for supplying a process gas to the plasma chamber. A waste gas discharge assembly is in flow communication with the plasma chamber for removing a waste gas resulting from a process performed in the plasma chamber, and includes a discharge pump. A sampling manifold is in flow communication with the plasma chamber. A sampling pump, in flow communication with the sampling manifold, induces flow of a sample gas from the plasma chamber through the manifold. A gas analyzer in flow communication with the manifold analyzes the sample gas flowing through the sampling manifold.

In another aspect of the present invention, the gas analyzer is a Residual Gas Analyzer-Quadropole Mass Spectrometer (RGA-QMS).

In another aspect of the present invention, an in situ monitoring method includes monitoring an initial gas in the plasma chamber, including inducing flow of the initial gas into the sampling manifold and analyzing the initial gas with the gas analyzer to measure background amounts of constituents. If the background amounts of the constituents exceed a contamination level, the plasma chamber and sampling manifold are baked to cause outgassing, and, after baking, the initial gas is again analyzed with the gas analyzer. A wafer is processed in the plasma chamber by supplying a process gas from the gas supply and a process reaction gas is produced. A process reaction is monitored by inducing flow of a process sample gas (which may include the process gas, the process reaction gas, or both) from the plasma chamber into the sampling manifold and analyzing the process sample gas with the gas analyzer. After the wafer is processed, it is unloaded, and a waste gas from the plasma chamber is discharged using the waste gas discharge assembly. The plasma chamber undergoes in situ cleaning in which a cleaning gas is supplied from the gas supply to the plasma chamber and a cleaning reaction gas is produced. A cleaning reaction is monitored by inducing flow of a cleaning sample gas (which may include the cleaning gas, the cleaning reaction gas, or both) from the plasma chamber into the sampling manifold and analyzing the cleaning sample gas with the gas analyzer.

In another aspect of the invention, an in situ cleaning method includes unloading the wafer after performing plasma etching of a polysilicon layer on a wafer in a plasma chamber. A cleaning gas is supplied from the gas supply to the plasma chamber at a set cleaning pressure and a set cleaning temperature. The cleaning gas includes a mixture of sulfur hexafluoride ($SF_6$) gas and chlorine ($Cl_2$) gas. The cleaning gas is supplied to separate, from inside the plasma chamber, a residue from the plasma process. The residue separated from the plasma chamber is then pumped out of the plasma chamber.

In another aspect of the invention, the cleaning method determines an optimized end point for the cleaning process. The cleaning pressure and cleaning temperature are reset to different values, after determining a cleaning process end point. Then a combination of the cleaning temperature and the cleaning pressure associated with a minimum cleaning process end point is identified. Then the next wafer is plasma etched, and thus the process is repeated. After several repetitions, the combination provides conditions for optimal cleaning.

Therefore, according to the present invention, a plasma etch process for the formation of polysilicon storage electrodes of semiconductor capacitors is monitored using the sampling manifold and the gas analyzer, and the cleaning process is also precisely monitored in situ in the process chamber, thereby allowing the recipe for the cleaning process to be optimized and improving the efficiency of semiconductor manufacturing using the plasma chamber.

BRIEF DESCRIPTION OF THE DRAWINGS

In the accompanying drawings:

FIG. 11 shows an RGA-QMS analysis for amplitude trends of main gases in the process chamber in situ cleaning process according to one embodiment of the present invention;

FIG. 12 shows an RGA-QMS analysis for amplitude trends of main gases in the process chamber in situ cleaning process in which the time for the main etch is extended longer than in FIG. 11.

DETAILED DESCRIPTION OF THE PREFERRED EMBODIMENTS

Reference will now be made in detail to the preferred embodiments of the present invention with reference to the accompanying drawings.

Figure 1:
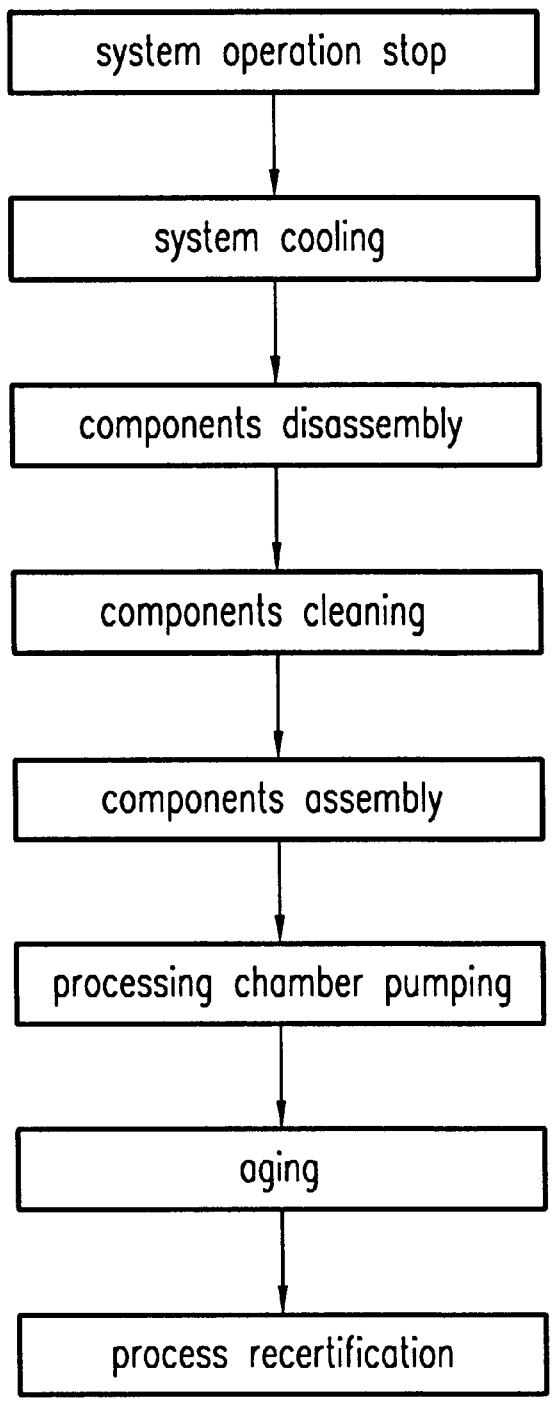
FIG. 1 is a processing sequence showing the conventional Preventive Maintenance (PM) cleaning process for removing the residues inside a plasma process chamber.
Figure 2:
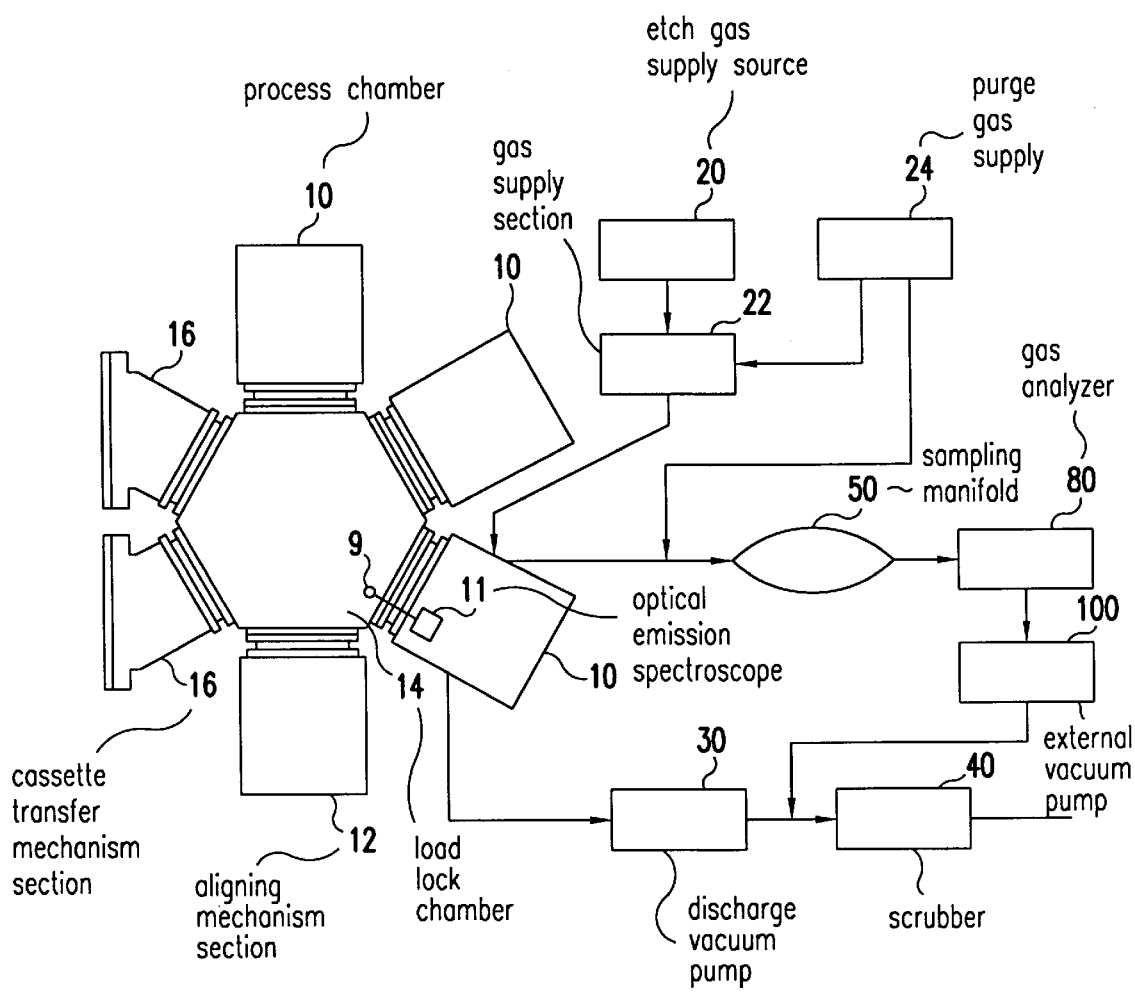
FIG. 2 is a schematic diagram showing the structure around a plasma processing apparatus with in situ monitoring according to one embodiment of the present invention.
Figure 3:
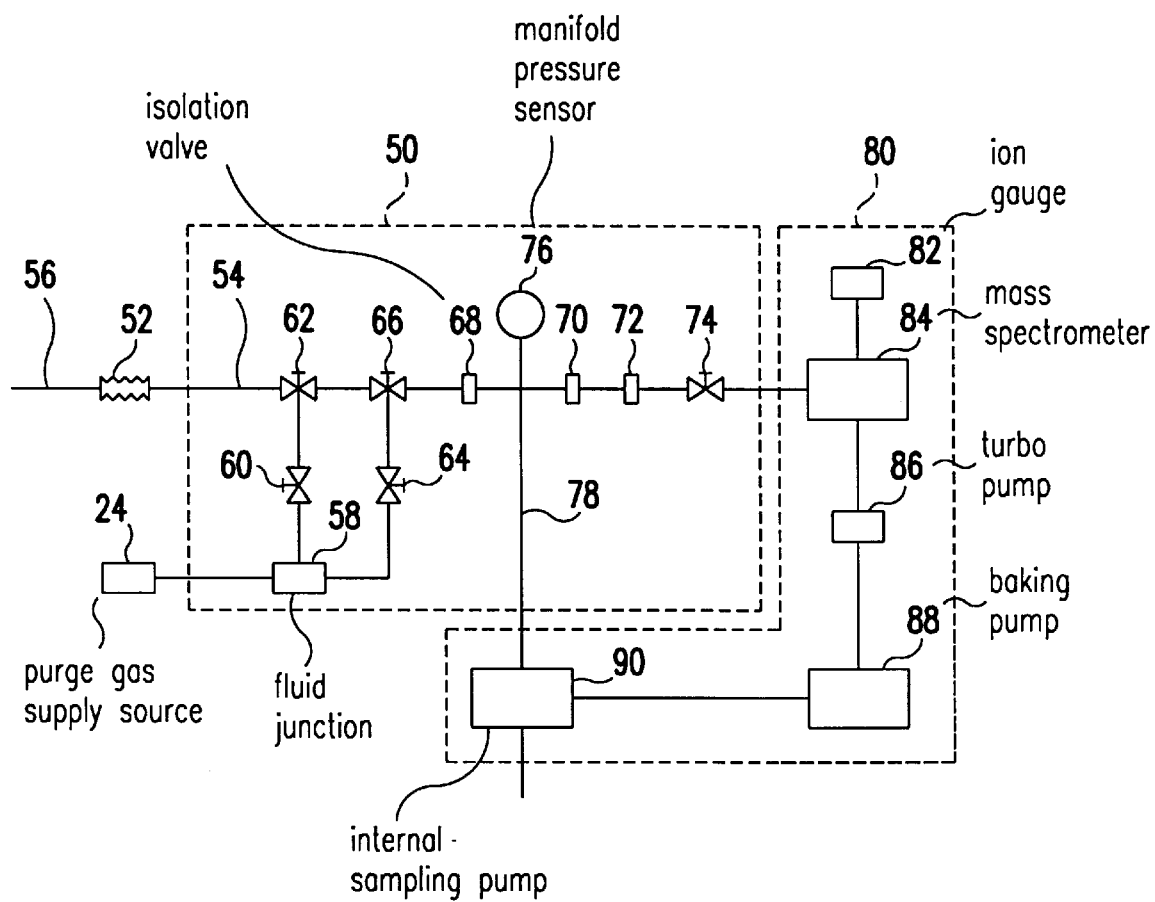
FIG. 3 is a detailed representation of a manifold and gas analyzer for the apparatus of FIG. 2.

FIG. 2 is a schematic representation showing the structure of an in situ monitoring plasma etch apparatus according to one embodiment of the present invention, and FIG. 3 is a detailed representation of the manifold and gas analyzer of apparatus of FIG. 2.

Referring to FIG. 2, the conventional dry-etching apparatus has multiple process chambers 10. A load lock chamber 14 having a transfer robot (not shown) is disposed between the process chamber 10 and a cassette transfer mechanism section 16 where wafers loaded on a cassette are supplied. An aligning mechanism section 12 aligns a flat edge of the wafer so that the wafers are aligned before they are supplied to the process chambers 10.

Etching using plasma is carried out inside the process chamber 10. An etch gas is supplied from an etch gas supply source 20 through a gas supply section 22 to the process chamber 10. The waste gas generated during the etch process is discharged after being cleaned in a scrubber 40 while being pumped through a discharge line by a discharge vacuum pump 30. Though described for an plasma etching process, a similar arrangement is used for plasma enhanced chemical vapor deposition (PECVD). Plasma etching and PECVD will be referred to as plasma processes, and the processing chamber 10 in which they occur will be called a plasma chamber.

According to the present invention, a sampling manifold 50 is installed for sampling gases from the process chamber 10 to allow in situ monitoring of the changes of the gases during reactions in the chamber 10. The sampling gas passing through the sampling manifold 50 is analyzed by a gas analyzer 80. An external sampling vacuum pump 100 is placed in a sampling gas flow path after the gas analyzer 80 to induce continuous flow of the sampling gas and to direct the gas leaving the analyzer 80 into the scrubber 40 where the gas is cleaned and subsequently discharged.

In some embodiments, an Optical Emission Spectroscope (OES) 11 is installed in the process chamber 10. The OES 11 is a means for measuring the variations in intensity of a specific wavelength of the light emitted during reactions in the processing chamber 10. The emitted light depends on reaction materials on the wafer and the gases used in the plasma process and the resulting reaction gases produced. In particular, the colors (hence the wavelengths) of emitted light depend on the gases present and the layers etched on a semiconductor substrate. The intensities of the wavelengths of the emitted light are detected and graphed as they vary in time, and points where the intensities of certain wavelengths abruptly change are found via the graph. As a result, the etch time for a certain layer is determined by detecting the end point time when the wavelengths associated with the layer being etched end and the time when the wavelengths associated with the layer below, i.e. the sub-layer, begin.

In addition, during wafer loading and unloading particles inside the process chamber 10 are introduced into the load lock chamber 14 and contaminate the other neighboring process chambers 10. A pressure sensor 9 is installed between the process chamber 10 and the load lock chamber 14 which can detect vacuum level variations between the two chambers. The OES 11 is connected to the pressure sensor 9 to monitor the pressure variations during each process step.

An embodiment of the gas sampling manifold 50 and the gas analyzer 80 are described with reference to FIG. 3. A sampling port line 56 is connected on one end to the outer wall of the process chamber 10, and connected on the other end to the sampling manifold 50 via a connector 52 of elastic material. A sampling line 54 of the sampling manifold 50, e.g., a line with a diameter of ⅜ inches made of electro-polished stainless steel, is connected to the elastic connector 52 at the chamber end of the sampling line 54. Along the sampling line 54, in serial order from the chamber end to an analyzer end, there are connected in flow communication a first air valve (i.e., a fluid valve) 62, a second air valve 66, a first isolation valve 68, a second isolation valve 70, a third isolation valve 72, and a gate valve 74. In this embodiment, the first air valve 62 and the second air valve 66 both have an orifice size of 100 microns, and the third isolation valve 72 has an orifice size of 250 microns. A purge gas, e.g., nitrogen ($N_2$) gas, from a purge gas supply source 24, is supplied to the first air valve 62 and the second air valve 66 via a fluid junction 58 through a third air valve 60 and a fourth air valve 64, respectively. Thus, purge gas is always supplied to the sampling manifold 50, even during times when the plasma chamber is not being sampled. In addition, a manifold pressure sensor, e.g., a Capacitance Manometer (CM) gauge 76, is connected in flow communication between the first isolation valve 68 and the second isolation valve 70 at a pump joint. At the same pump point, a pumping line 78 is connected in flow communication with the sampling line 54. The pumping line 78 is connected to an internal sampling pump 90 provided in a gas analyzer 80, and is in flow communication with the scrubber 40, via the external sampling pump 100.

In this embodiment, the gas analyzer 80 is connected to the sampling line 54 at the analyzer end. The gas analyzer 80 uses a commercial Residual Gas Analyzer-Quadrupole Mass Spectrometer (RGA-QMS), which includes a mass spectrometer 84. In the gas analyzer, the mass spectrometer is connected to a turbo pump 86, a baking pump 88, and the internal sampling pump 90. The mass spectrometer 84 is connected to an ion gauge 82 also within the gas analyzer. The internal sampling pump 90 receives gases from the manifold 50 and mass spectrometer 84 and directs the gases into the scrubber 40 via the external pump 100.

The RGA-QMS used as the gas analyzer 80 is a commercial model. Gas analysis is made using a mass spectrum acquired by the following steps. The gases used or remaining in the process chamber 10 are sampled and flow into the manifold 50 and are pumped into the mass spectrometer 84. Electrons accelerated at 70 electron Volts (eV) of potential difference collide with the sample gases so as to ionize them. The ionized gases pass through the RGA-QMS which constantly maintains direct current and alternating current so as to let only ions having a specific ratio of mass to charge (m/z) pass through. As a result, the ionized gases can be analyzed. The RGA-QMS used in this embodiment is a movable system, wherein an ion source is a Closed Ion Source (CIS). Unlike an Open Ion Source (OIS) used in a typical sputtering process, a CIS can analyze a low pressure process gas as well as a high pressure bulk gas.

The sampling pressure inside the sampling manifold 50 is maintained below the pressure of the process chamber 10 using a critical orifice in a range from about 100 to about 250 microns. That is, a vacuum level inside the sampling manifold 50 is greater than a vacuum level in the process chamber 10.

Figure 4:
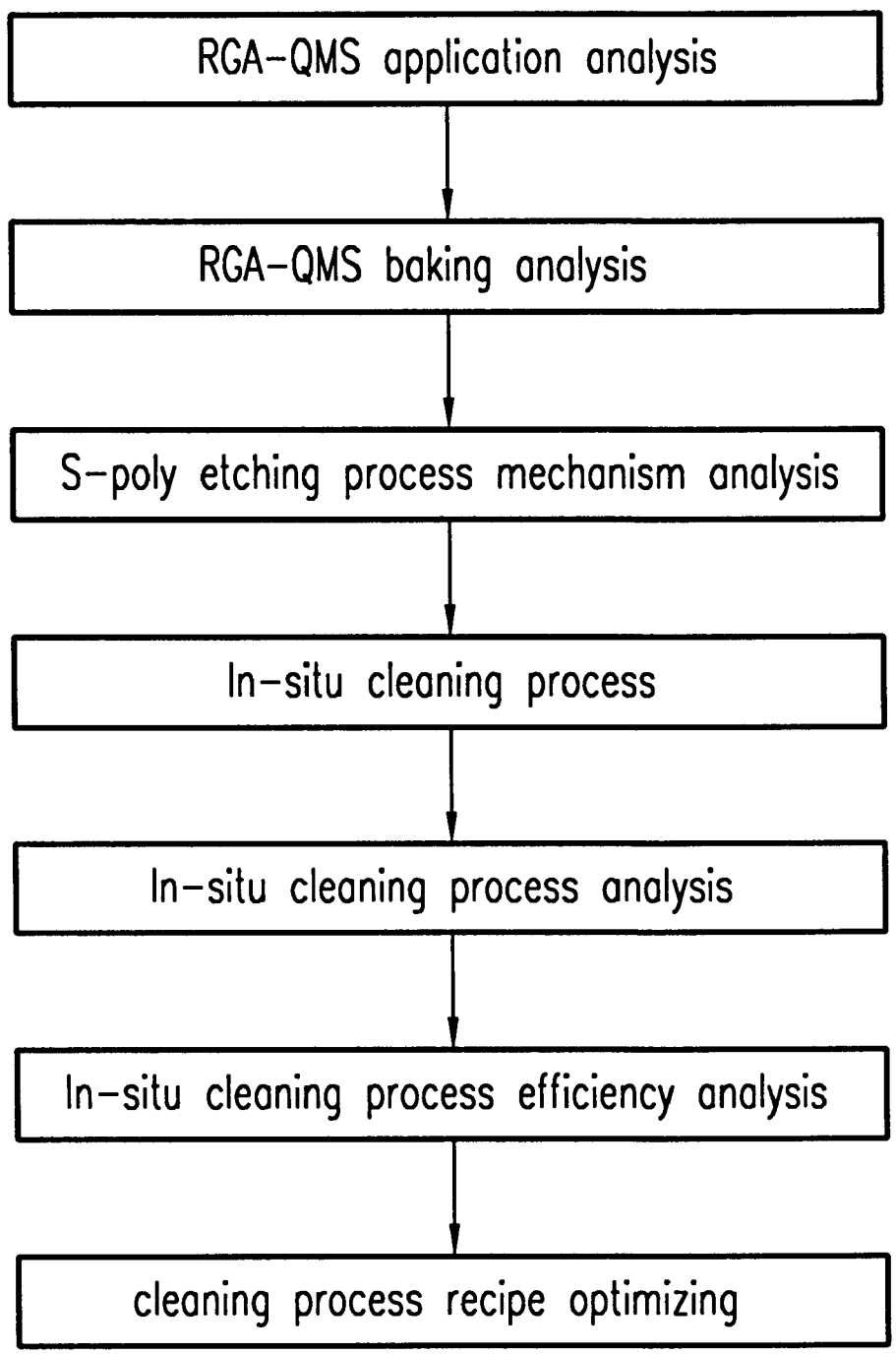
FIG. 4 is a flow diagram showing the processing sequences for monitoring the etching and the cleaning processes according to one embodiment of the present invention.

FIG. 4 is a schematic representation showing embodiments of the monitoring method for a plasma process occurring inside the process chamber 10 and the in situ cleaning method. In these embodiments, the plasma process is a plasma etch process, and the cleaning process is a cleaning process after a plasma etch of a polysilicon layer.

In this embodiment of the monitoring process, first, the gases are tested, using the RGA-QMS, for example. That is, the gas analyzer 80 is connected to the sampling manifold 50. A purge gas such as nitrogen gas is supplied into the gas analyzer 80 by closing the first air valve 62 and the third air valve 60, and opening the second air valve 66 and the fourth air valve 64. Then, by closing the fourth air valve 64, and opening the first air valve 62, the sampling of the gas in the process chamber 10 starts. By operating the internal or external sampling pump 90 or 100, respectively, or both, as necessary based on the pressure indicated on the sampling pressure inside, e.g. the CM gauge 76, the pressure inside the sampling line 54 can be controlled to be less than the pressure inside the process chamber 10.

In one embodiment of the method, a RGA-QMS baking test is performed next in order to reduce the background value. Since the RGA-QMS is sensitive to the contamination of the analyzing system itself, in this embodiment the background spectrum is analyzed every wafer processing cycle, i.e., once per wafer processed in the plasma chamber. The contamination levels in the system due to moisture and oxygen elements are examined. When a contamination level is high, the process chamber is baked at a temperature around 250° C. and the sampling manifold is baked at a temperature around 150° C. so as to minimize and control the contamination.

In particular, the molecular contaminants water ($H_2O$), hydrogen ($H_2$), oxygen ($O_2$), argon (Ar), and carbon dioxide ($CO_2$) are monitored as impurities. Baking accelerates the outgassing of these contaminants and reduces the contamination levels in the system. The new levels are analyzed to obtain an initial background spectrum of the system from the RGA-QMS.

Next, a specific process for fabricating semiconductor wafers is preformed. At substantially the same time, the process gases are sampled and analyzed. That is, for example, the sampled gases are obtained during reaction of etch gases such as a main etch gas with the wafer. The monitoring is important for the formation of storage polysilicon electrodes of DRAMs, and for detecting an over etch, for example.

Then, the wafers are unloaded from the process chamber. A cleaning gas is supplied into the process chamber, and the cleaning of the plasma chamber is carried out in situ. While the cleaning process is performed, the process chamber gases continue to be sampled and the cleaning reaction is analyzed by the gas analyzer, such as the RGA-QMS.

Through the analyses for the gases before and after the cleaning process, or through the analyses for the contaminants and the particles, for example, the effect of the in situ cleaning process can be measured. Finally a recipe can be developed for optimizing the time, pressure, and temperature of the cleaning process.

In the present invention, using a critical orifice of 250 microns in the sampling manifold, an etch process carried out under relatively low pressure can be analyzed. The RGA-QMS provides the spectrum ranging from 1 to 200 atomic mass units (amu) within an analysis time of 6.7 sec. Analysis is performed every analysis scan time, where the scan time equals the analysis time. Before and after the processing, i.e., every wafer processing cycle, the purge gas is analyzed and the background spectrum of the sampling system is confirmed to ensure the reliability of the analysis results.

In two particular exemplary embodiments of the present invention, a polysilicon storage electrode etch process is carried out under one of two etch recipes.

Figure 5:
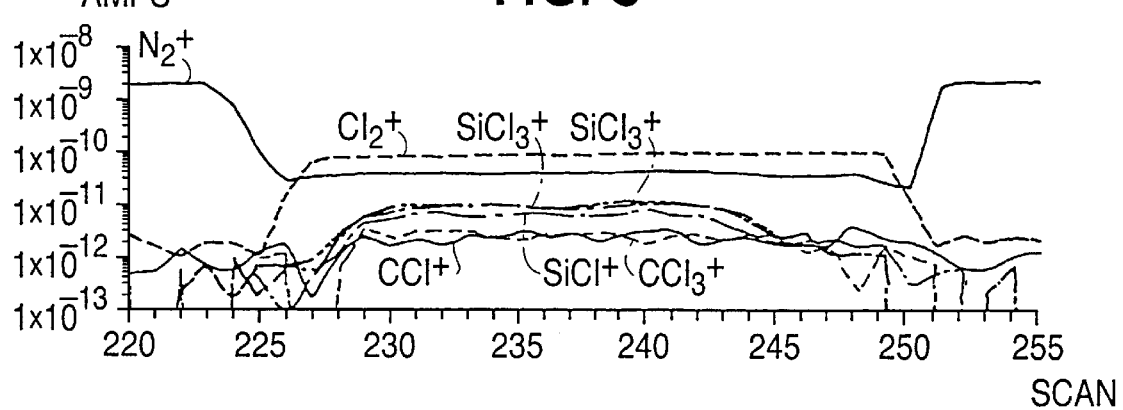
FIG. 5 shows the RGA-QMS analysis result for amplitude trends of the main gases used in the storage polysilicon etch process.
Figure 6:
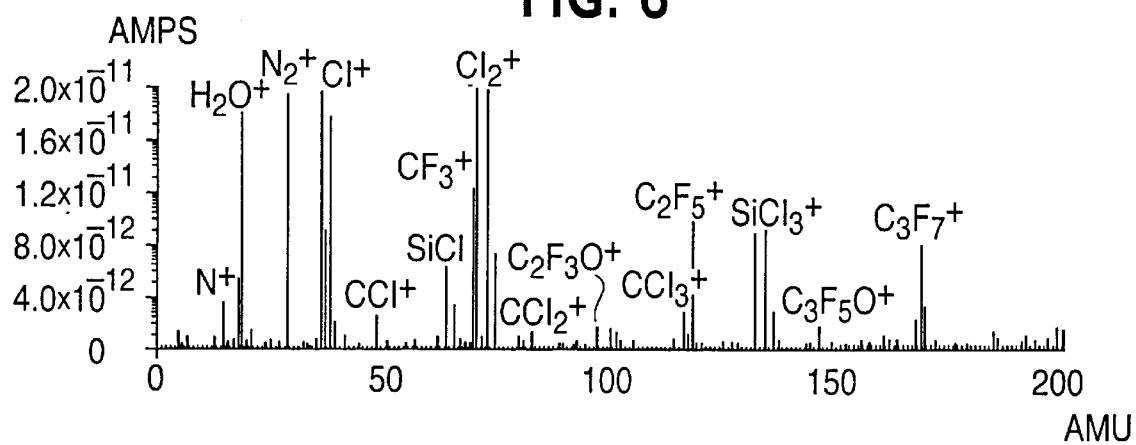
FIG. 6 shows a spectrum at scan 233 for the main etch step of FIG. 5.
Figure 7:
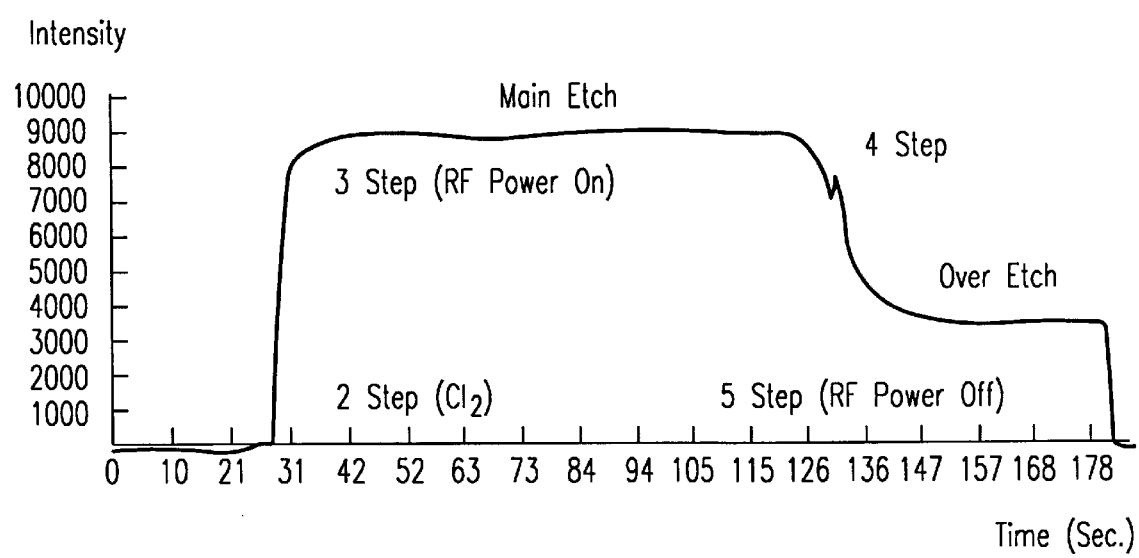
FIG. 7 shows an Optical Emission Spectroscope (OES) analysis result for the storage polysilicon etch process using etch recipe 1.

Etch recipe 1 uses chlorine ($Cl_2$) gas as an etch gas, and FIG. 5 shows the RGA-QMS analysis result of the amplitude trends of the main gases used in the polysilicon etch process. FIG. 6 shows a spectrum at scan 233 of the main etch step of FIG. 5. FIG. 7 shows an OES analysis result for light of wavelength 405 nanometers (nm), which is utilized in the polysilicon etch process using etch recipe 1.

Referring to FIG. 5 and 6, the polysilicon is etched by an etchant gas having chlorine ($Cl_2$) and produces process reactant gases such as silicon chlorides ($SiCl_x$, e.g., $SiCl^+$, $SiCl_3^+$). The graphical shape of silicon trichloride ($SiCl_3+$) from the RGA-QMS shows elevated levels for about 17 scans (about 110 seconds) which matches with the result of the End Point Detection (EPD) spectrum of 405 nm in the FIG. 7, where the intensity is high for about 110 seconds in the interval from an elapsed time of about 30 seconds to about 140 seconds.

Figure 8:
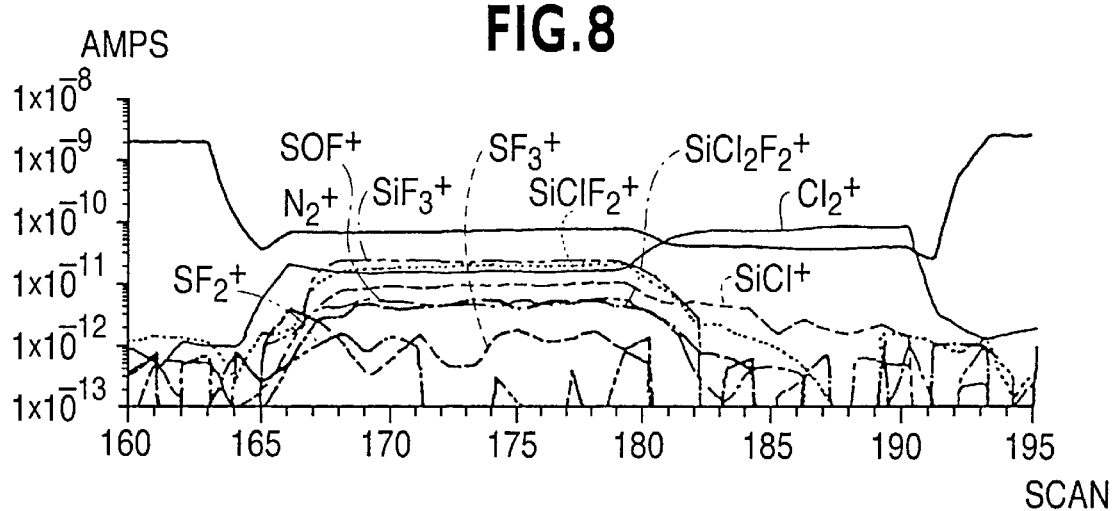
FIG. 8 shows the RGA-QMS analysis result for amplitude trends of the main gases used in the storage polysilicon etch process using recipe 2.
Figure 9:
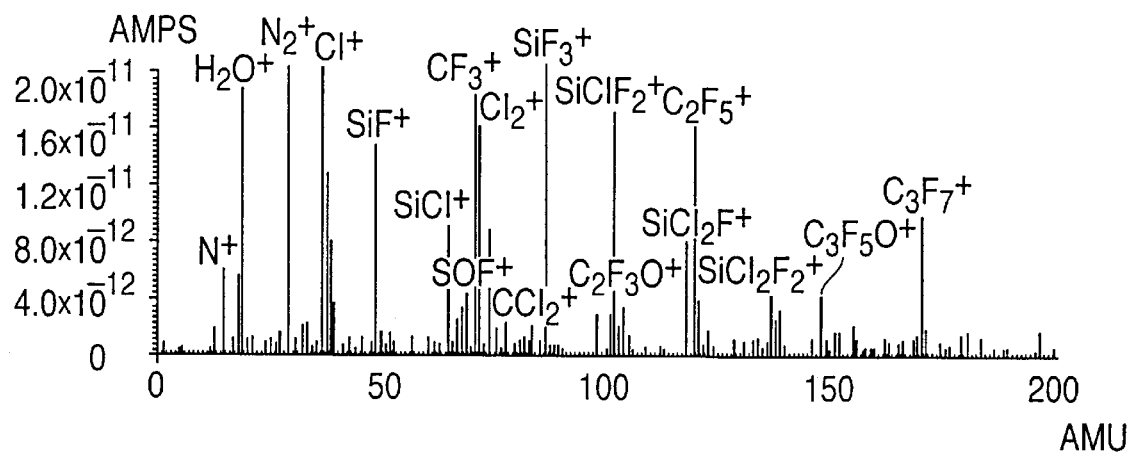
FIG. 9 shows a spectrum at scan 172 for the main etch step of FIG. 8.
Figure 10:
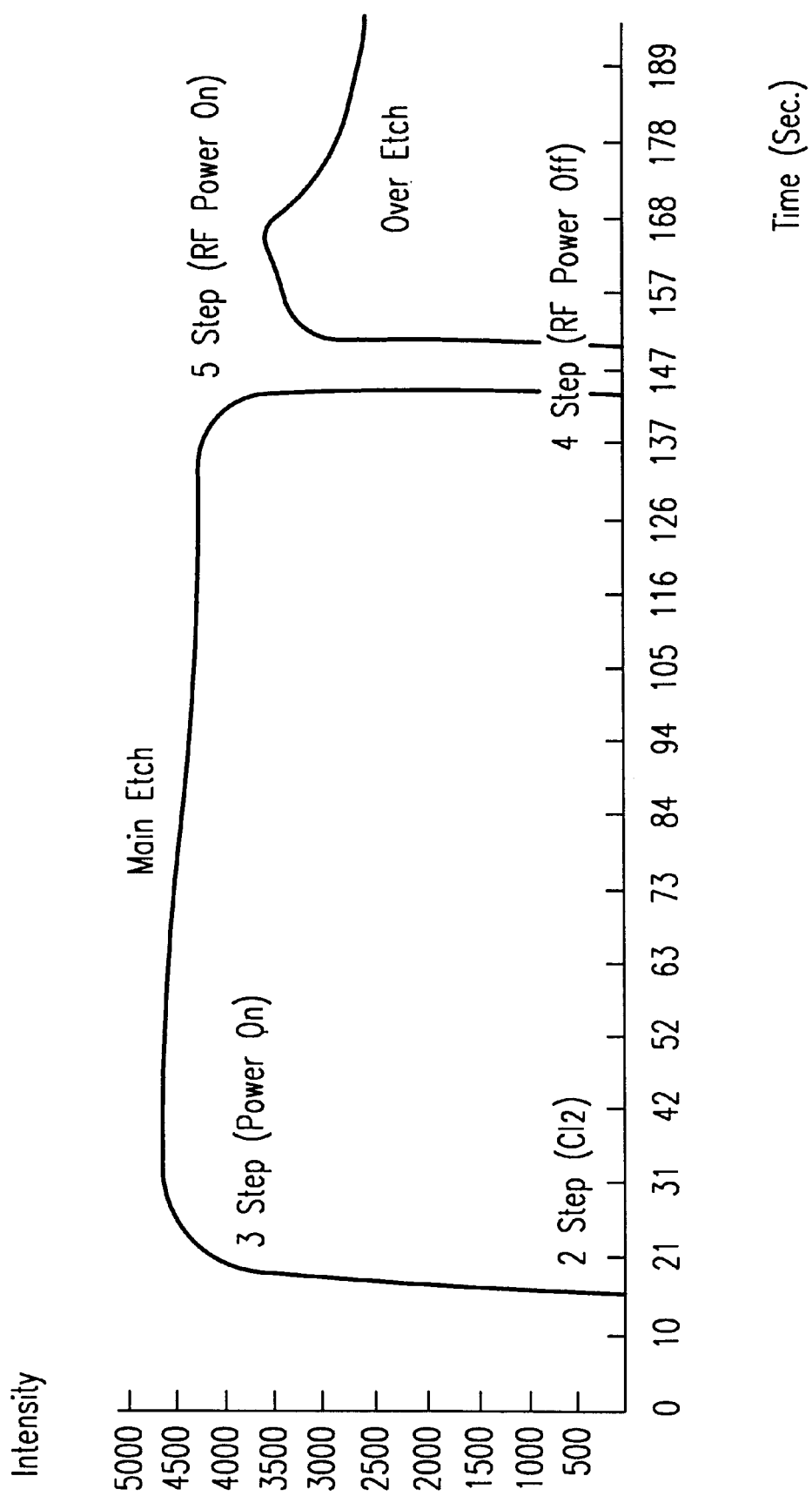
FIG. 10 shows an OES analysis result for the storage polysilicon etch process using etch recipe 2.

Etch recipe 2 uses a mixture of sulfur hexafluoride and chlorine ($SF_6+Cl_2$) gas as the polysilicon etch gas. FIG. 8 shows the RGA-QMS analysis result for the amplitude trends of the main gases used in the polysilicon etch process using recipe 2. FIG. 9 shows a spectrum at scan 172 during the main etch step of FIG. 8. FIG. 10 shows an OES analysis result for the polysilicon etch process using etch recipe 2.

Referring to FIGS. 8, 9 and 10, after performing the main etch for the polysilicon using the $SF_6+Cl_2$ gas, from about scan 167 to about scan 180 for a duration of about 90 seconds, over etch is carried out using $Cl_2$ gas to about scan 190. $SF_6$ is an inert gas, but it forms reactive fluoride ion in a radio frequency (RF) field and it can be used in the polysilicon etch with the $Cl_2$ gas.

From the analysis results of FIG. 8 and 9, when $SF_6$ and $Cl_2$ gas are used as etchant gas, the main by-product is a silicon fluoride ($SiF_x$, e.g., $SiF^+$, $SiF_2^+$, $SiF_3^+$) gas, and the polysilicon is etched into gas such as a silicon chloride or silicon chloro fluoride ($SiCl_xF_y$, e.g., $SiCl^+$, $SiClF_2^+$, $SiCl_2F_2^+$, and $SiCl_2F_3^+$). The RGA-QMS analysis for the gas shows a result similar to the End Point Detection (EPD) spectrum of FIG. 10. From FIG. 10, the main etch is carried out at the third step after the RF is powered-on, and it is powered off at the fourth step, i.e. for a duration of about 100 seconds starting at an elapsed time of about 20 seconds. Then, over etch is carried out at the fifth step when the RF is powered on again.

The in situ cleaning process in the process chamber in this embodiment of the present invention is composed of three steps: an etch step using $SF_6+Cl_2$ as etchant; an aging step using $Cl_2$; and a pumping step to pump out the waste gas including residue of polymers separated from the walls of the plasma chamber.

FIG. 11 shows an RGA-QMS analysis for amplitude trends of main gases in the process chamber during in situ cleaning. The etch time is 60 seconds. Fluorine (F) element functions as a reactive etchant inside the process chamber, and etches the polymer inside the process chamber into $SiF_x$, a gas that can be pumped out. In addition, by-products such as $SOF^+$, $SO_2^+$, are produced which become part of the waste gas pumped out. From FIG. 11, a main product of the cleaning etch, $SiF_3^+$ rapidly increases right after the etch begins, and gradually decreases until the cleaning etch ceases without reaching a detectable end point.

FIG. 12 shows an RGA-QMS analysis for amplitude trends of main gases during in situ cleaning process, in which the etch time is extended to 120 seconds. From FIG. 12, it is evident that the etch is completed at about 74 seconds.

Figure 13:
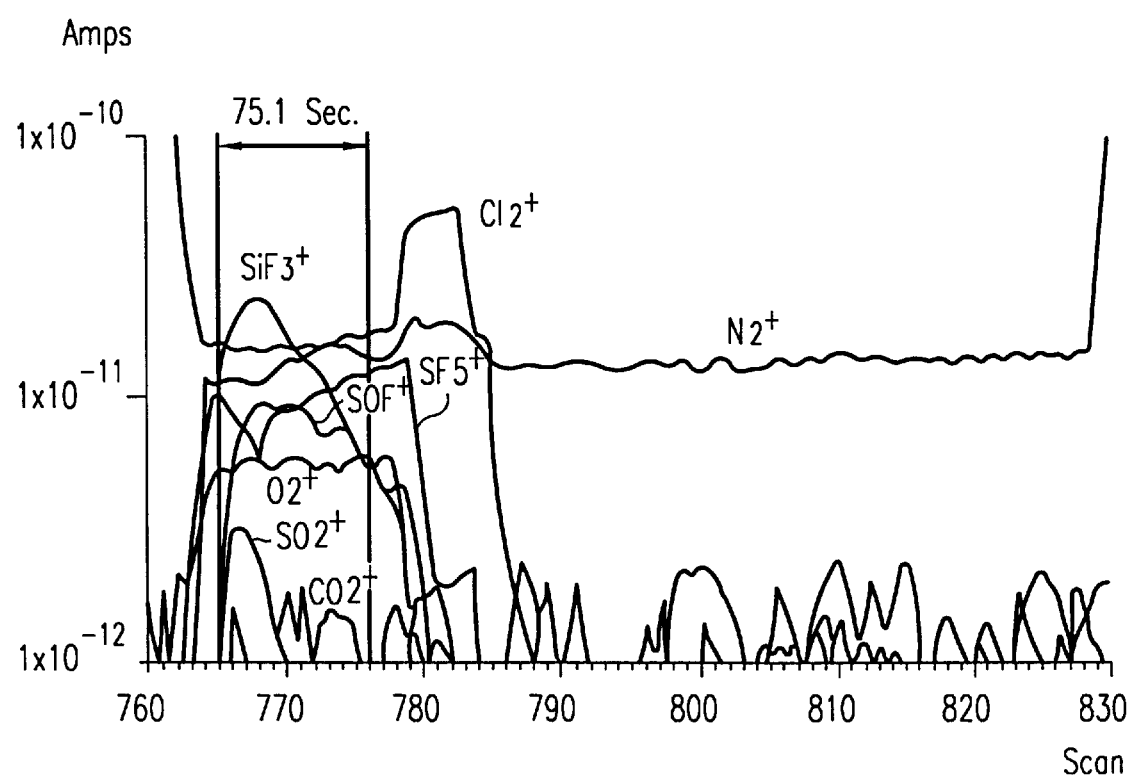
FIG. 13 shows an RGA-QMS analysis for amplitude trends of main gases during the optimized in situ cleaning process in the process chamber.

FIG. 13 shows an RGA-QMS analysis for amplitude trends of main gases during an optimized in situ cleaning process obtained by changing the etch time, according to another embodiment of the present invention. That is, the cleaning etch, using $SF_6+Cl_2$ gases, is carried out for about 100 seconds at a pressure of 15 mTorr, and with RF power of 400 Watts (W) to ensure sufficient time (at least 75 seconds) for cleaning without using excessive time. The aging process, using $Cl_2$ gas, is carried out for 30 seconds, at a pressure of 20 torr, and with RF power 400 W. After the RF power is turned off, waste gas pumping is carried out for 300 seconds.

In order to measure the effects of the in situ cleaning process according to the present invention, the particulate matter on wafers were examined. The particles on the silicon oxide surface of a wafer processed in the chamber were examined with SURFSCAN (a wafer inspection system manufactured by KLA/Tencor). It was confirmed that the particles are reduced after the in situ cleaning process of the present invention.

In addition, before and after the cleaning process step, the metal and ion impurities such as iron (Fe), chromium (Cr), nickel (Ni), zinc (Zn), titanium (Ti), sulfur (S), chlorine (Cl), fluoride (F), and ammonium ($NH_4$) inside the process chamber were examined using Total X-ray Reflection fluorescence (TXRF)/High Performance Ion Chromatography (HPIC) to confirm the beneficial effects of the in situ cleaning process step.

As a result, according to the present invention, the reactions of the gases during the etch process and the cleaning process are analyzed by using the RGA-QMS gas analyzer as an in situ monitoring system for the process chamber. Based on these results, the reactive etchant, and reaction by-products during the polysilicon etch are confirmed. Furthermore, the reaction mechanism and the end point of the cleaning etch process are exactly detected so that the etch time during the cleaning process is optimized, reducing the time losses for the cleaning process. Further, the generation of particles is suppressed. As a result, the operational efficiency of the facility is improved.

It will be apparent to those skilled in the art that various modifications and variations of the present invention can be made without departing from the spirit or scope of the invention. Thus, it is intended that the present invention cover the modifications and variations of this invention provided they come within the scope of the appended claims and their equivalents.

What is claimed is:

1. A plasma process apparatus having in situ monitoring, the apparatus comprising:
   a plasma chamber;
   a process gas supply in flow communication with the plasma chamber, the process gas supply supplying a process gas to the plasma chamber;
   a waste gas discharge assembly in flow communication with the plasma chamber, the waste gas discharge assembly including a discharge pump and removing a waste gas resulting from a process performed in the plasma chamber;
   a sampling manifold in flow communication with the plasma chamber;
   a sampling pump in flow communication with the sampling manifold, wherein flow of a sample gas is induced from the plasma chamber through the sampling manifold; and
   a gas analyzer in flow communication with the sampling manifold, the gas analyzer analyzing the sample gas flowing through the sampling manifold.

2. The apparatus of claim 1, wherein the gas analyzer is a Residual Gas Analyzer-Quadrupole Mass Spectrometer (RGA-QMS) comprising a mass spectrometer, a turbo pump, and a baking pump.

3. The apparatus of claim 1, the sampling manifold comprising a critical orifice maintaining a manifold vacuum level inside the sampling manifold greater than a chamber vacuum level inside the plasma chamber.

4. The apparatus of claim 3, the sampling manifold further comprising:
   a sampling line in flow communication with the plasma chamber at a chamber end and the gas analyzer at an analyzer end; and
   a first air valve, a second air valve, a first isolation valve, a second isolation valve, a third isolation valve, and a gate valve located successively in a flow path of the sampling line from the chamber end to the analyzer end.

5. The apparatus of claim 4, the sampling manifold further comprising:
   a manifold pressure sensor connected to a pump joint located in the flow path of the sampling line between the first isolation valve and the second isolation valve; and
   a sampling pump line providing a flow path from the pump joint to the sampling pump.

6. The apparatus of claim 5, the gas analyzer further comprising an internal sampling pump in flow communication with the sampling pump line of the sampling manifold.

7. The apparatus of claim 6, the sampling manifold further comprising:
   a purge gas supply line in flow communication with a purge gas supply, the purge gas supply line supplying a purge gas to the plasma chamber;
   a purge junction in flow communication with the purge gas supply line;
   a third air valve located in a flow path from the purge junction to the first air valve; and
   a fourth air valve located in a flow path from the purge junction to the second air valve.

8. The apparatus of claim 7, wherein
   an orifice of the first isolation valve is 100 microns,
   an orifice of the second isolation valve is 100 microns, and
   an orifice of the third isolation valve is 250 microns.

9. The apparatus of claim 7, wherein the sampling line is made of electro-polished stainless steel.

10. The apparatus of claim 7, wherein the gas analyzer is a Residual Gas Analyzer-Quadrupole Mass Spectrometer (RGA-QMS) comprising a mass spectrometer, a turbo pump, and a baking pump, and
    the internal sampling pump is in flow communication with the baking pump.

11. The apparatus of claim 10, the plasma chamber further comprising an Optical Emission Spectroscope (OES) monitoring a time-change in intensity of a set wavelength of light associated with a specific gas.

12. The apparatus of claim 11, further comprising:
    a load lock chamber at a load lock vacuum level, connected to the plasma chamber; and
    a pressure sensor connected to the OES monitoring changes in the chamber vacuum level and the load lock vacuum level.

13. The apparatus of claim 12, the waste gas discharge assembly further comprising a scrubber in flow communication with the discharge pump and the gas analyzer, the scrubber cleaning the waste gas passing out of the discharge pump and cleaning an analyzed gas passing out of the gas analyzer.

14. The apparatus of claim 13, wherein the plasma chamber is a chamber in which a storage polysilicon electrode of a semiconductor capacitor is plasma etched.

15. The apparatus of claim 14, wherein the process gas includes a mixture of sulfur hexafluoride ($SF_6$) gas and chlorine ($Cl_2$) gas.

16. A plasma process apparatus comprising:
    a plasma chamber;
    a gas supply section supplying a process gas and a purge gas to said plasma chamber;
    a sampling manifold in flow communication with said plasma chamber, said sampling manifold being maintained at a manifold pressure different than a chamber pressure of said plasma chamber;
    a gas analyzer in flow communication with said sampling manifold; and
    a sampling pump coupled to said gas analyzer, said sampling pump inducing flow of a sample gas from said plasma chamber through said sampling manifold to said gas analyzer,
    said gas analyzer analyzing the purge gas supplied to said plasma chamber, and the process gas as mixed with a reaction gas generated during processing in said plasma chamber, as respective different samples.

17. The plasma process apparatus of claim 16, wherein said gas supply section also supplies the purge gas directly to said sampling manifold.

18. The plasma process apparatus of claim 17, wherein said gas supply section supplies the purge gas directly to said sampling manifold when said gas analyzer is not analyzing samples from said plasma chamber.

19. The plasma process apparatus of claim 16, further comprising:
a discharge pump discharging from said plasma chamber waste gas generated during processing; and
a scrubber coupled to said discharge pump and said sampling pump, said scrubber cleaning the discharged waste gas provided by said discharge pump and the flow of sample gas induced through said gas analyzer by said sampling pump.

20. The plasma process apparatus of claim 16, further comprising:
an optical emission spectroscope monitoring a time-change in intensity of a set wavelength of light associated with a specific gas within said plasma chamber;
a load lock chamber connected to said plasma chamber; and
a pressure sensor coupled to said optical emission spectroscope, said pressure sensor monitoring changes in a vacuum level of said plasma chamber and a vacuum level or said load lock chamber.

21. The plasma process apparatus of claim 16, wherein said gas analyzer further comprises a baking pump, said plasma chamber and said sampling manifold being baked at respectively different temperatures to minimize contamination levels.

22. The plasma process apparatus of claim 16, wherein said gas analyzer is a residual gas analyzer-quadrupole mass spectrometer.

23. The plasma process apparatus of claim 16, wherein the manifold pressure is maintained lower than the chamber pressure.

* * * * *